INTERMEDIATE-FREQUENCY COUPLING CIRCUIT
Filed Sept. 25, 1967
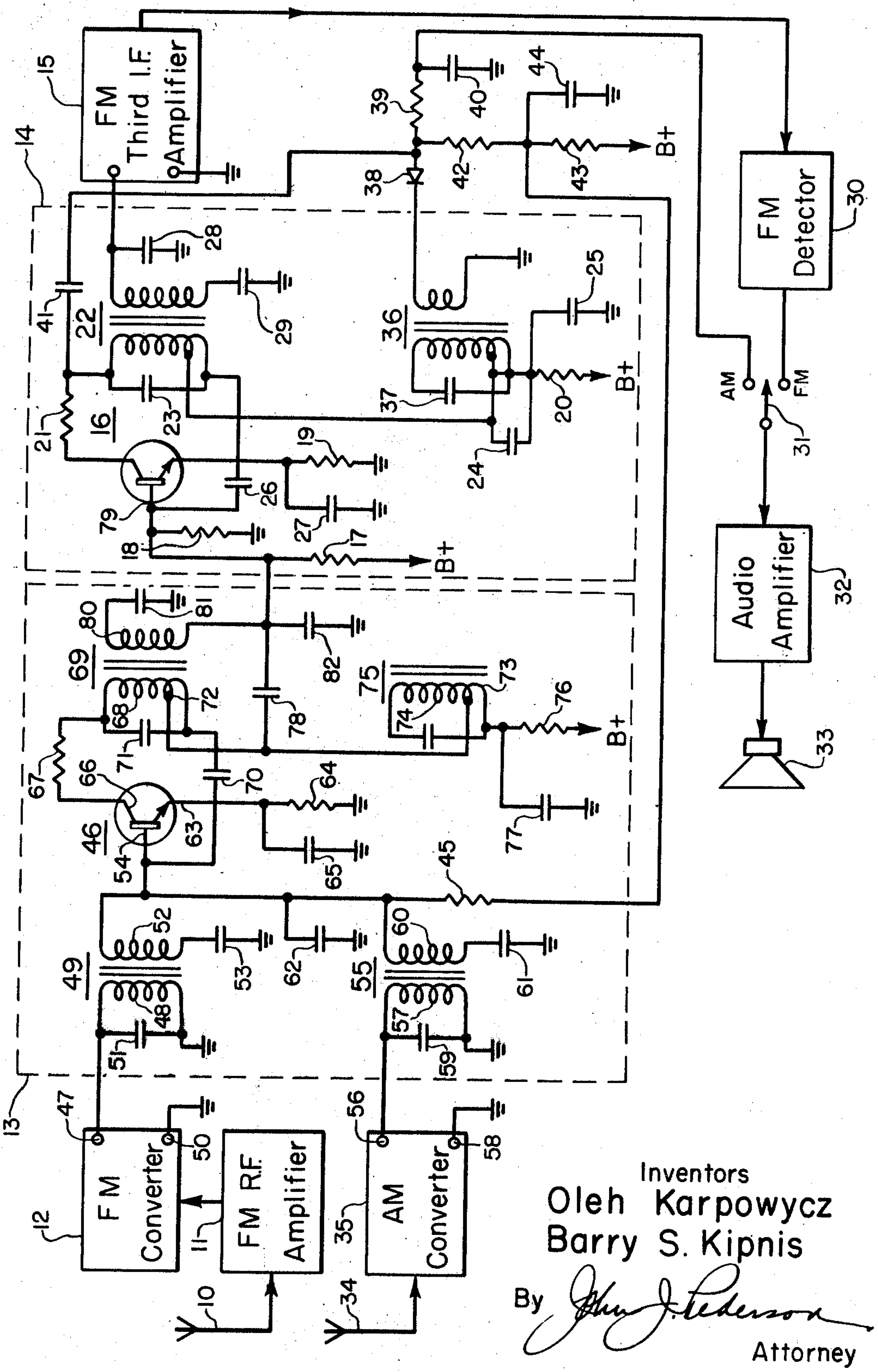
Inventors
Oleh Karpowycz
Barry S. Kipnis
By John J. Pederson
Attorney United States Patent Office 3,497,811

Patented Feb. 24, 1970

3,497,811

INTERMEDIATE-FREQUENCY COUPLING CIRCUIT

Oleh Karpowycz, Addison, and Barry Stephen Kipnis, Des Plaines, Ill., assignors to Zenith Radio Corporation, Chicago, Ill., a corporation of Delaware Filed Sept. 25, 1967, Ser. No. 670,201

Int. Cl. H04b 1/16

U.S. Cl. 325—317 3 Claims

ABSTRACT OF THE DISCLOSURE

A multi-band AM/FM wave-signal receiver includes an economical intermediate-frequency coupling circuit which requires fewer components than previous designs. In particular, two interstage IF transformers intended to operate at different frequencies each have secondary windings $\pi$-tuned to resonance. A single capacitor serves as one leg of the $\pi$ for both windings and at the same time provides a proper match to the subsequent IF amplifier stage. The capacitor further serves to by-pass any extraneous VHF signals present at the output of the receiver RF converter stage to ground.

Background of the invention

This invention relates in general to multi-band wave-signal receivers, and more particularly to an improved intermediate-frequency coupling network for use therein. The invention is especially but not exclusively applicable to the intermediate-frequency amplifier system of a superheterodyne radio receiver capable of selectively receiving either amplitude-modulated (AM) carrier waves lying in the AM broadcast band or frequency-modulated (FM) carrier waves of the FM broadcast band.

Under established U.S. standards governing radio broadcasts there exists two broadcast bands, an AM low-frequency band extending from 550 kHz. to 1600 kHz. and an FM high-frequency band extending from 88 mHz. to 108 mHz. In designing consumer-type radio receivers capable of receiving signals in these widely divergent frequency bands, it has become almost universal practice to utilize different intermediate-frequencies for the two operating modes, a low-frequency in the order of 450 kHz. for AM reception and a higher frequency in the order of 10 mHz. for FM reception. This is necessary because of certain practical design considerations, namely image response and selectivity, which preclude the use of a common IF frequency.

Obviously, for reasons of economy and to avoid unnecessary duplication of circuitry, it is desirable that the same intermediate-frequency (IF) amplifier devices serve in both modes, and preferably with a minimum of switching to avoid the electrical noise and connection problems generally associated with switch contacts. Thus, it has become almost universal practice to employ IF amplifiers having coupling circuits adapted to operate in the two IF bands without switching, the circuits being arranged so as to have minimum interaction with each other.

Coupling networks for AM/FM amplifiers have therefore generally taken the form of two independent tuned circuits, parallel-connected to the common amplifier devices. Such circuits, while providing generally satisfactory performance and enabling the use of a common amplifier device, have in themselves been somewhat complicated and expensive. As a result, a need for simplification and improvement of these interstage coupling circuits has existed to reduce the component cost of consumer AM/FM receivers.

Accordingly, it is a general object of the invention to provide a new and improved interstage coupling network for use in a multi-band wave-signal receiver.

It is a more specific object of the invention to provide an interstage coupling network which requires fewer components than its prior art counterparts.

It is a still more specific object of the invention to provide an economical interstage coupling network for an AM/FM receiver which obviates the need for at least one coupling capacitor.

The invention is directed to a multi-band AM/FM wave-signal receiver of the type having a plane of reference potential and an intermediate-frequency amplifier channel operable at first and second predetermined frequencies. The receiver includes a source of intermediate-frequency signals at the first predetermined frequency and a first interstage coupling transformer for translating signals at the first predetermined frequency. The first transformer has a primary winding coupled to the source of first predetermined frequency signals and a secondary windings. A first capacitor is connected between one terminal of the secondary winding of the first transformer and the plane of reference potential. The receiver further includes a source of intermediate-frequency signals at the second predetermined frequency and a second interstage coupling transformer for translating signals at the second predetermined frequency. The second transformer has a primary winding coupled to the source of second predetermined frequency signals and a secondary winding. A second capacitor is connected between one terminal of the secondary winding of the second transformer and the plane of reference potential. A third capacitor connected between the remaining terminals of the first and second secondary windings and the plane of reference potential cooperates wth the first and second capacitors to resonate the secondary windings at their respective operating frequencies. Further included in the receiver is an intermediate-frequency amplifier device operable at the first and second predetermined frequencies and means for coupling the juncture formed by the third capacitor and the remaining terminals of the secondary windings to the intermediate-frequency amplifier device.

Brief description of the drawings

The features of the present invention which are believed to be novel are set forth with particularity in the appended claims. The invention, together with further objects and advantages thereof, may best be understood by reference to the following description taken in connection with the accompanying drawing, in which the single figure is a schematic representation, partially in block form, of a wave-signal receiver embodying the present invention.

Description of the preferred embodiment

With the exception of certain detailed circuitry in the first IF amplifier stage, the illustrated receiver is essentially conventional in design and therefore only a brief description of its structure and operation need be given here. In accordance with standard practice, a common intermediate-frequency channel is utilized for signal processing in both AM and FM operating modes.

Considering FM-mode operation first, a received FM signal is intercepted by an antenna 10 and coupled in a conventional manner to a radio-frequency (RF) amplifier 11, which may contain one or more frequency-selective stages. The output of RF amplifier 11 is applied to an FM converter stage 12, wherein it is translated to a predetermined intermediate-frequency for subsequent amplification by first, second and third IF amplifier stages 13, 14 and 15, respectively. Although IF amplifier stage 13 incorporates certain novel input and output coupling circuitry which will be discussed in detail later, it otherwise operates as a conventional IF amplifier stage and the amplified intermediate-frequency output signal therefrom is applied to second IF amplifier stage 14 for further amplification.

IF amplifier stage 14 incorporates a transistor amplifier device 16 connected in a conventional common-emitter configuration with bias resistors 17, 18 and 19 and collector decoupling resistor 20. The signal from stage 13 is applied to the base of transistor 16, and after amplification in that device is impressed through isolation and amplitude-limiting resistor 21 across the primary winding of an interstage coupling transformer 22, which is tuned to resonance by a shunt-connected capacitor 23. A tap on that winding is by-passed to ground at FM IF signal frequencies by series-connected capacitors 24 and 25 to provide a predetermined amount of signal loss in the output circuit of transistor 16, without which that stage would be unstable. A capacitor 26 is connected between the primary winding of transformer 22 and the base of transistor 16 to provide neutralization for that device, and the emitter of transistor 16 is by-passed to ground at signal frequencies by a capacitor 27. The secondary winding of transformer 22 is tuned to the FM IF frequency by a pair of $\pi$-connected capacitors 28 and 29, which serve to couple the IF output signal from stage 14 to the third IF amplifier stage 15.

IF amplifier 15 further amplifies and limits the FM IF signal before applying it to an FM detector stage 30, which may comprise any one of a number of FM detector circuits including the well-known ratio-detector circuit. The audio-frequency output signal from detector 30 is applied to one terminal of a mode switch 31, which selects an appropriate detector output signal for application to audio amplifier 32 depending on the operating mode of the receiver. Amplifier 32 amplifies the applied audio signal to a level sufficient for driving a loudspeaker 33.

During AM operation an intercepted signal is coupled by conventional means from antenna 34 to an AM converter 35, wherein it is converted to an intermediate-frequency, preferably much lower than that of the IF output signal from FM converter 12. The AM IF signal from converter 35 is amplified by first IF amplifier 13 and applied to second IF amplifier 14 in much the same manner as the FM IF signal. During AM reception FM interstage transformer 22 is not resonant at the operating frequency of IF amplifier 14 and therefore presents only a negligible load impedance to transistor 16. The effective collector load now comprises another tuned transformer 36, the primary winding of which is resonated by a capacitor 37 at the AM IF operating frequency. This winding, like the primary winding of FM interstage transformer 22, is tapped to introduce a predetermined amount of signal loss to stage 14 to assure stable operation. An untuned secondary winding on transformer 36 applies the amplified AM IF output signal to a detector diode 38, which derives audio-frequency information from the AM IF signal for application to the remaining terminal of switch 31. A resistor 39 and a capacitor 40 cooperate with diode 38 in the detection process by serving to filter the derived audio signal.

Detector 38 performs an ancillary function of developing an AGC bias for controlling the gain of IF amplifier stage 13 to compensate for variations in the level of intercepted signals. The exact manner in which this is accomplished is described and claimed in U.S. Letters Patent No. 3,287,644 to Dwight J. Poppy, assigned to the present assignee.

During FM mode operation a portion of the FM IF output signal trom transistor 16 is coupled by a capacitor 41 to diode 38, which develops a negative bias depending on the relative amplitude of the FM IF signal. Similarly, diode 38 develops a negative bias during AM mode operation according to the relative amplitude of the AM IF signal. The bias thus developed is applied to one end of the voltage divider formed by resistors 42 and 43, the other end of which connects to source B+. The juncture of these resistors is by-passed to ground at AM and FM IF signal frequencies by a filter capacitor 44 and is connected by an isolation resistor 45 to the base of the amplifier transistor 46 of first IF amplifier stage 13. As the amplitude of the IF signal increases, the control bias applied to transistor 46 becomes less positive, thereby causing the gain of that device to decrease so as to maintain a relatively constant IF output level.

Having considered briefly the structure and operation of the receiver as a whole, we can now look to the detailed circuitry of IF amplifier stage 13. One output terminal 47 of FM converter 12 is coupled to one end terminal of the primary winding 48 of an FM interstage transformer 49 and the remaining end terminal of winding 48 and the other output terminal 50 of converter 12 are grounded. Winding 48 is shunted by a tuning capacitor 51. The secondary winding 52 of transformer 49 has one end terminal connected to ground by a tuning capacitor 53 and its other end terminal connected to the base 54 of transistor 46.

The output of AM converter 35 is applied to base electrode 54 by an interstage coupling transformer 55. One output terminal 56 of converter 35 is connected to one end terminal of the primary winding 57 of transformer 55 and the remaining end terminal of winding 57 and the remaining output terminal 58 of converter 35 are grounded. Primary winding 57 is tuned to resonance at the AM IF frequency by a shunt-connected capacitor 59, and the secondary winding 60 of transformer 55 has one end terminal connected to ground by a tuning capacitor 61 and its other end terminal connected to base 54. In accordance with the invention, a capacitor 62 is connected from base 54 to ground. As will be seen, this component performs several functions as a common matching and tuning element in conjunction with the secondary windings 52 and 60 of transformers 49 and 55, respectively.

The emitter 63 of transistor 46 is connected to ground by the parallel combination of an emitter bias resistor 64 and a by-pass capacitor 65 and the collector 66 is connected through an isolation and amplitude-limiting resistor 67 to one end terminal of the primary winding 68 of an FM interstage coupling transformer 69. The other end terminal of winding 68 is connected by a neutralizing capacitor 70 to base 54 and the entire winding is shunted by a capacitor 71. Winding 68 has a tap 72 which is connected to a tap 73 on the single winding 74 of an AM interstage coupling transformer 75. One end terminal of winding 74 is connected to source B+ by a collector decoupling resistor 76 and is by-passed to ground at signal frequencies by a capacitor 77. Tap 73 is further connected by a capacitor 78 to the base 79 of amplifier transistor 16.

The secondary winding 80 of transformer 69 has one end terminal connected to ground by a capacitor 81 and its other end terminal connected directly to base 79 and thence to ground by a capacitor 82. This capacitor, like capacitor 62 in the input circuit, serves as a common element in both the AM and FM output circuits to achieve a reduction of at least one passive component over prior art circuits. The manner in which this is done will be explained shortly.

In operation, the intermediate-frequency output signal from FM converter 12 is applied to the primary winding 48 of interstage transformer 49. The secondary winding 52 of this transformer is tuned to the FM IF frequency, which in practice is approximately 10.7 mHz., by capacitors 53 and 62. Capacitor 53 and capacitor 62 are connected in a $\pi$-network configuration relative to winding 52. It will be appreciated that the two capacitors comprise a voltage divider network to the FM IF signal included in winding 52, and that by adjusting their relative capacitances, and hence their impedances at the FM IF frequency, a preselected amount of signal loss can be introduced into the input circuit of transistor 46. For present-day IF amplifier transistors, which have a gain of approximately 50 db, a total signal loss in each IF stage of approximately 20 db is necessary to maintain stability and to allow for normally expected variations in component values during production. Practical design considerations, however, limit the minimum capacity of the capacitors so that it is neither practical nor desirable to obtain the full 20 db signal loss in the input stage. Thus, it is desirable to obtain part of the total required signal loss in the output circuit of the transistor, and to that end the present embodiment employs tapped AM and FM output circuits in both its first and second IF amplifier stages.

The AM IF signal from converter 35 is applied to the primary winding 57 of transformer 55, which is tuned to the AM IF frequency of approximately 455 kHz. Like winding 52, the secondary winding 60 of transformer 55 is $\pi$-network tuned which permits a predetermined amount of loss to be obtained for the AM IF signal. In this case capacitor 61 and the parallel combination of capacitors 53 and 62 forms the two legs of the $\pi$-network, and the same considerations apply for the selection of the capacitors as applied to the FM input circuit. Of course, it is necessary that the net capacity of the capacitors across windings 52 and 60 be such that resonance can be achieved in the two windings with reasonable "Q" factors for the particular transformer designs being used.

The novel input coupling arrangement just described is of great significance in that it permits capacitor 62 to serve as a common element in both the AM and FM $\pi$-networks, thus achieving a reduction of at least one component plus labor over previous AM/FM IF coupling network designs. Secondary windings 52 and 60 are so designed that the capacity range of the required FM $\pi$-network output capacitor overlaps the range of the required AM $\pi$-network output capacitor. It then becomes a matter of selecting a value for capacitor 62 which falls within the common range and at the same time provides the required amount of signal loss for the FM and AM IF signals. Another function performed by capacitor 62 is the by-passing to ground of any spurious VHF signals at the base 54 of transistor 46 resulting from the operation of FM converter 12. This function was previously performed by a ferrite-sleeve RF choke or similar filter network. By properly selecting capacitor 62, a very effective by-pass is provided without this choke and without affecting the desired FM IF signal.

The AM and FM signals applied to base 54 are amplified by transistor 46 and applied to respective ones of interstage transformers 69 and 75. Transistor 46 is connected in a common emitter configuration and biased in a conventional manner by resistors 64 and collector decoupling 76. Capacitor 65 by-passes the emitter to ground at signal frequencies and capacitor 70 provides a sufficient amount of neutralization to prevent oscillation of transistor 46. The primary 68 of interstage transformer 69 is resonant at the FM intermediate frequency and has a tap 72 which introduces a predetermined amount of stabilizing signal loss. The AM interstage transformer 75, on the other hand, is not resonant at the FM IF frequency and acts as a choke to allow only unidirectional B+ current to be applied to collector 66 through resistors 67 and 76.

Secondary winding 80 of transformer 69 is $\pi$-network tuned by capacitor 81 and capacitor 82. These capacitors serve not only to tune winding 80, but also to introduce a predetermined amount of stabilizing signal loss to the input circuit of second IF amplifier 14.

During AM reception transformer 69 is not resonant at the IF operating frequency and the AM IF signal appears across winding 74, which is resonant and tapped at tap 73 to introduce a predetermined amount of signal loss in the AM output circuit of IF amplifier stage 13. Capacitor 78 and the parallel combination of capacitors 82 and 81 form a voltage divider which couples a predetermined portion of the amplified AM IF signal from transformer 75 to the base of transistor 16.

As in its input circuit, the output circuit of IF amplifier stage 13 utilizes novel coupling circuitry which allows certain components in that circuit to perform multiple functions, thereby achieving a savings of at least one passive component. In this case, capacitor 82 serves: (1) in conjunction with capacitor 81 to provide the necessary tuning capacitance for secondary winding 80, (2) as part of a voltage-divider network for coupling a portion of the amplified AM IF signal from transformer 75 to transistor 16, and (3) in conjunction with capacitor 78 as a by-pass to ground at FM IF frequencies for tap 72 on the primary winding 68 of transformer 69. The features of this output circuit are claimed in the copending application of Oleh Karpowycz, Ser. No. 670,184, assigned to the present assignee and filed concurrently herewith.

Two novel coupling circuits have been described which permit simplification of the intermediate-frequency amplifier stages of an AM/FM radio receiver without sacrificing performance. In particular, use of both described circuits results in the elimination of at least two capacitors over prior art designs. It will be appreciated that this, coupled with the attendant cost of labor and the present-day high volume production of consumer radio receivers, results in a cost reduction of great significance.

The following are a set of component values for the coupling circuit of the invention which have been found to provide satisfactory operation. It will be appreciated that these values are given by way of example, and that other values may be substituted without departing from the principles of the invention.

C51—40 mmfd.
C53—150 mmfd.
C59—390 mmfd.
C61—115 mmfd.
C62—1500 mmfd.
C65—0.1 mfd.
R45—2200 ohms.
R64—680 ohms.
TR46—Fairchild SE 5006.
T49:
Primary, 30 turns No. 36, 9/32 in. form.
Secondary, 14 turns No. 36, 9/32 in. form.
T55:
Primary, 179 turns No. 4/43, litz 9/32 in. form, 322 $\mu$h. at 1 kHz.
Secondary, 348 turns No. 4/43, litz 9/32 in. form, 1170 $\mu$h. at 1 kHz.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

We claim:

1. In a multi-band AM/FM wave-signal receiver of the type having a plane of reference potential and an intermediate-frequency amplifier channel operable at first and second predetermined frequencies:

- a source of intermediate-frequency signals at said first predetermined frequency;
- a first interstage coupling transformer for translating signals at said first predetermined frequency and having a primary winding coupled to said source of first predetermined frequency signals, and a secondary winding;
- a first capacitor connected between one terminal of said secondary winding of said first transformer and said plane of reference potential;

a source of intermediate-frequency signals at said second predetermined frequency;

a second interstage coupling transformer for translating signals at said second predetermined frequency and having a primary winding coupled to said source of second predetermined frequency signals, and a secondary winding;

a second capacitor connected between one terminal of said secondary winding of said second transformer and said plane of reference potential;

a third capacitor connected between said remaining terminals of said first and second secondary windings and said plane of reference potential to cooperate with said first and second capacitors in resonating said secondary windings at their respective operating frequencies;

an intermediate-frequency amplifier device operable at said first and second predetermined frequencies;

and means for coupling the juncture formed by said third capacitor and said remaining terminals of said secondary windings to said intermediate-frequency amplifier device.

2. A wave-signal receiver as described in claim 1 wherein said first predetermined frequency is in the order of 10.7 mHz. and said second predetermined frequency is in the order of 455 mHz.

3. A wave-signal receiver as described in claim 2 wherein said first, second and third capacitors are in the order of 150 micro-micro-farads, 115 micro-micro-farads and 1500 micro-micro-farads, respectively.

References Cited

FOREIGN PATENTS 648,259 1/1951 England.

ROBERT L. GRIFFIN, Primary Examiner

JOSEPH A. ORSINO, Jr., Assistant Examiner

U.S. Cl. X.R.

325—488, 491